United States Patent
Ema

[19]

[11] Patent Number: 6,049,085
[45] Date of Patent: Apr. 11, 2000

[54] CHARGED PARTICLE BEAM EXPOSURE METHOD AND METHOD FOR MAKING PATTERNS ON WAFER

[75] Inventor: Takahiro Ema, Tokyo, Japan

[73] Assignee: NEC Corporation, Tokyo, Japan

[21] Appl. No.: 09/041,339

[22] Filed: Mar. 12, 1998

[30] Foreign Application Priority Data

Mar. 13, 1997 [JP] Japan .................................... 9-058750

[51] Int. Cl.⁷ ................................................ H01J 37/302
[52] U.S. Cl. ................................ 250/492.22; 250/492.23
[58] Field of Search ........................ 250/492.22, 492.23, 250/492.2, 398

[56] References Cited

U.S. PATENT DOCUMENTS

| | | | |
|---|---|---|---|
| 4,099,062 | 7/1978 | Kitcher | 250/492.22 |
| 4,298,803 | 11/1981 | Matsuura et al. | 250/492.22 |

FOREIGN PATENT DOCUMENTS

| | | | |
|---|---|---|---|
| 61-45375 | 10/1986 | Japan | H01L 21/30 |
| 271509 | 3/1990 | Japan | H01L 21/30 |
| 6163383 | 6/1994 | Japan | H01L 21/027 |

*Primary Examiner*—Jack Berman
*Attorney, Agent, or Firm*—Hayes, Soloway, Hennessey, Grossman & Hage, PC

[57] ABSTRACT

In a charged-particle beam exposure method, an aperture mask for partial overall exposure is used to perform exposure of a pattern so that there is no overlapping, thereby forming a number of transfer patterns. When doing this, exposure is done with an amount of exposure that is ½ the amount capable of forming a pattern. Then, the shot position is changes so that the exposure position overlaps with the previous exposure position and exposure is done to form the next transfer pattern. When doing this, the amount of exposure is also ½ the amount required to form a pattern. In this manner, exposure is performed two times each, with the amount of exposure being ½ each time, as the exposure position is shifted.

16 Claims, 9 Drawing Sheets

1 0 1 ⋯ APERTURE MASK
1 0 2 ~ 1 0 5 ⋯ TRANSFER PATTERNS 1 0 1 ⋯APERTURE MASK
1 0 2 ∼ 1 0 5 ⋯TRANSFER PATTERNS

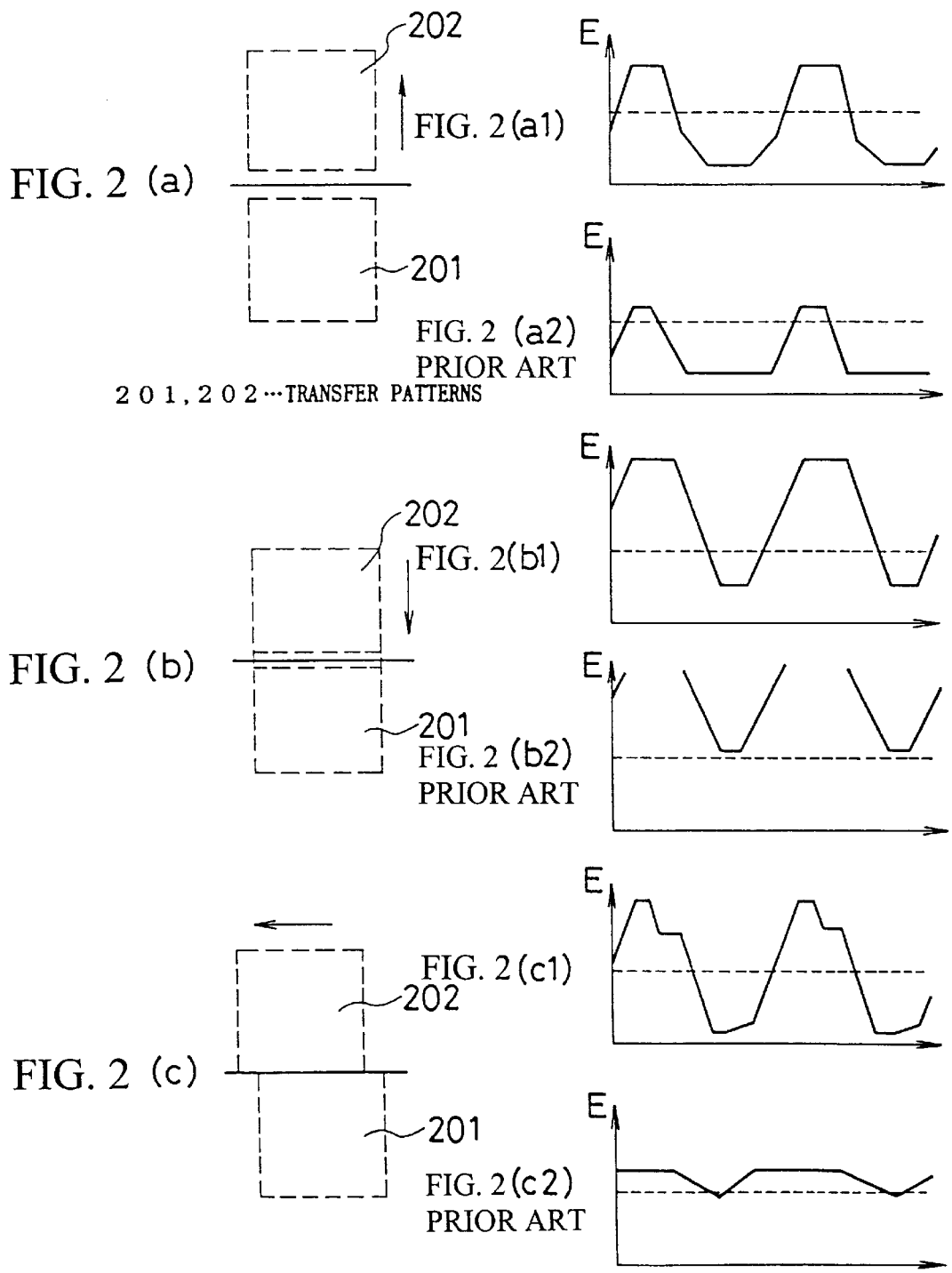

303  302

L5  305

304

308  307

306

301 ··· APERTURE MASK
302~308 ··· TRANSFER PATTERNS 4 0 1 ··· EDGE PART
4 0 2 ··· APERTURE MASK

501 — ELECTRON SOURCE
502 — FIRST APERTURE MASK
503 — SECOND APERTURE MASK
504 — WAFER
505 — ELECTRON BEAM 6 0 1 ··· APERTURE MASK
6 0 2 ~ 6 0 4 ··· TRANSFER PATTERNS
6 0 5 ··· BRIDGE
6 0 6 ··· OPEN

FIG. 7 (a) PRIOR ART
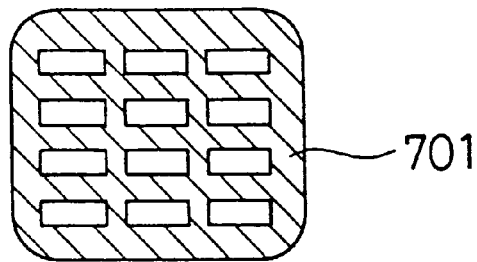
FIG. 7 (b) PRIOR ART
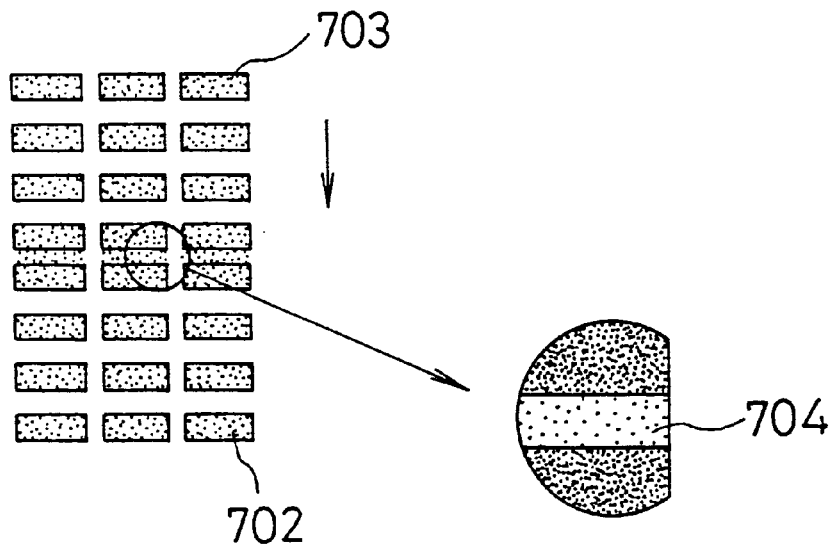
7 0 1 ··· APERTURE MASK
7 0 2, 7 0 3 ··· TRANSFER PATTERNS
7 0 4 ··· BRIDGE

801~804⋯TRANSFER PATTERNS 901, 902 ··· TRANSFER PATTERNS

CHARGED PARTICLE BEAM EXPOSURE METHOD AND METHOD FOR MAKING PATTERNS ON WAFER

BACKGROUND OF THE INVENTION

1. Field of the Invention

The present invention relates to a charged particle beam exposure method and more specifically to a charged particle beam exposure method whereby the overall desired pattern of a semiconductor device is repeatedly exposed.

2. Description of Related Art

Lithography which uses a charged particle beam such as typified by an electron beam, as compared with optical lithography, is expected to provides an advantage in terms of fineness.

However, this method is accompanied by the problem of difficulty in maintaining a high throughput. However, in LSI devices having many repeated patterns, using an EB (electron beam) mask having formed in it an extracted repeated pattern to repeatedly perform partial overall exposure, it is possible to improve the throughput.

FIG. 5(a) is a simplified drawing of an electron beam exposure apparatus that performs partial overall exposure, and FIG. 5(b) is a magnified perspective view of an aperture mask.

The electron beam that is emitted from the electron source 501 is formed into a rectangular shape by the first aperture mask 502, which is used for beam formation. As shown in FIG. 5(b), several types of patterns selected-from CAD data base of the device as partial overall patterns, are previously formed in a second aperture mask 503.

The electron beam 505 that passes through the first aperture mask 502 is deflected by a deflector above the second aperture mask 503 so as to pass through a selected pattern on the second aperture mask.

An objective lens and deflector beneath the second aperture mask 503 reduce the pattern on the second aperture mask 503 and transfer it to an appropriate position on the wafer 504.

Then, the X-Y stage (not shown in the drawing) onto which the wafer 504 is mounted is moved by one pitch, and exposure is performed on a region that is neighboring to the region which has just previously been exposed. Another method is to deflect the electron beam so as to expose a region on the wafer that is shifted by one pitch.

In the above-described method, the shot size that can be transferred at one time is limited by the electron beam optics that are used, and is at present very small compared to the size of chips.

For this reason, the pattern on a chip is divided for arrangement on the mask. However, for a DRAM or other LSI in which there are many repeated patterns, it is possible to reduce the number of patterns that are arranged on the aperture mask.

When using this partial overall exposure method, however, to prevent defects from occurring between adjacent transfer patterns and in the connection parts between transferred parts, it is necessary to eliminate mutual position shifts between shots as much as possible.

However, in partial overall exposure in which each one of multiple shots which would exceed millions of shots, is repeatedly transferred, one by one, it is difficult to completely eliminate defects that are caused by variation between shot positions.

Reasons for these variations are thought to include local position skew that is dependent upon the linearity accuracy of the D/A converter used in controlling the deflector, and suddenly occurring position skew that is caused by environmental factors such as vibration and electrical noise.

When position skew occurs because of such factors, there is a danger of shorts or bridge defects occurring at the connection part between adjacent shots.

For example, when performing partial overall exposure using the aperture mask 601 which is shown in FIG. 6(a), if each shot is made at the proper position, the transfer pattern 602, as shown in FIG. 6(b), is connected smoothly, with no breaks.

However, if there is shift between the partial overall shots, the transfer pattern will not be connected properly.

For example, if the transfer pattern 603 is shifted to the left or right with respect to the previously formed transfer pattern 604, a bridge 605 such as shown in FIG. 6(c) will occur, and if the transfer pattern 603 is shifted upward with respect to the transfer pattern 604, a short 606 will be formed, as shown in FIG. 6(d).

If the aperture mask 701 which is shown in FIG. 7(a) is used to perform partial overall exposure and the transfer pattern 703 is shifted downward with respect to the previously formed transfer pattern 702, there is a high possibility that a bridge 704 will be formed between transfer patterns, as shown in FIG. 7(b).

Because of the above-described problem, there has been a proposal in the past for the purpose of solving the problem of defects in the connection part between shots used in partial exposure.

In Japanese Unexamined Patent Publication (KOKAI) No. 57-112016 (Japanese Examined Patent Publication (KOKOKU) No. 61-45375), there is a proposed method (hereinafter referred to as the first improvement example) for use in a variable formed exposure which exposes an arbitrary rectangular pattern while moving the beam a small amount at a time.

In this method, as shown in FIG. 8, when forming a straight-line transfer pattern 801, the length of the formed beam is gradually increased in stepwise fashion for each shot to form the transfer pattern 802, and after the formed beam reaches a maximum length, this length is maintained, and a shot is performed to form the transfer pattern 803, after which at the edge at the end point to be described the formed beam length is shortened gradually each shot in stepwise fashion, so as to form the transfer pattern 804.

In the example shown in the drawing, all regions for the transfer pattern 801 are exposed four times each. It is said that according to this method, it is possible to prevent the occurrence of bulging or depressions at the joints between each shot.

In Japanese Unexamined Patent Publication (KOKAI) No. 2-71509, there is proposed a method (hereinafter referred to as the second improvement example) of reducing the defects at connection parts between shots by providing a protruding part at the edge of a pattern of an aperture mask.

Specifically, when a transfer pattern 901 is to be formed, a protruding part is provided beforehand at a pattern edge of the aperture used to perform partial overall exposure, one shot being used to perform exposure so that the corresponding protruding parts of the transfer patterns 902 are caused to overlap, thereby forming the continuous transfer pattern 901, as shown in FIG. 9.

In the past examples described with reference to FIG. 6 and FIG. 7, there were problems of bridges and shorts occurring because of position skew between shots.

In the first improvement example, which is shown in FIG. 8, there is the drawback that in this method, uses a formed beam to perform exposure, the need to perform multiple exposures as the beam shape is changed hinders the achievement of high throughput, and also the drawback that the transfer pattern that can be formed is limited to a straight-line pattern.

In the second improvement example, which is shown in FIG. 9, because of the need to form a part (such as a protrusion) that is not intrinsically part of the pattern, there is the problem of having to add a change to the pattern shape at the end of a pattern when forming the aperture mask based on CAD data.

This results in a protrusion or the like existing in the outermost part of the transfer pattern which intrinsically is not part of the pattern.

Additionally, in the second improvement example, similar to the example of the past which is shown in FIG. 7, if a vertical direction shift occurs between shots, there is an increased possibility of the occurrence of a bridge defect in the pattern between shots that are adjacent in that direction.

Therefore, an object of the present invention is to provide an exposure method which uses the partial overall exposure to suppress the occurrence of bridges between adjacent patterns, and the occurrence of opens, pattern bulging and bridges at the connection parts in a pattern, without using an aperture mask having special pattern, and without a great reduction in throughput.

SUMMARY OF THE INVENTION

To achieve the above-noted object, the present invention provides a charged-particle beam exposure method which, when transferring a pattern onto a wafer using the partial overall exposure method, the exposure amount for each shot is established as 1/n of an amount of normalized exposure that is necessary to form a pattern, where one and the same location is exposed n times as the shot position is moved each time.

More specifically, the present invention provides a method for exposing a charged-particle beam on a wafer whereby a unit pattern is repeatedly exposed on the wafer by a partial overall exposure method, a shot position being shifted for each shot, the charged-particle beam exposing method comprising steps of, establishing an amount of exposure for each shot as being 1/n (where n is an integer of 2 or greater) of an amount of exposure that is necessary to form a pattern, and performing overlaid multiple exposures n times on the same region formed on the wafer, while shifting the shot position so that part of a current exposure region thereof overlays onto an immediately previous exposure region.

BRIEF DESCRIPTION OF THE DRAWINGS

FIGS. 2(a) to 2(c) are drawings which show the transfer patterns and

FIGS. 2(a1), 2(b1) and 2(c1) the distribution of accumulated energy by way of illustrating the first embodiment of the present invention, and FIGS 2(a2), 2(b2) and 2(c2) are graphs showing distribution of accumulated energy in accordance with the prior art.

FIG. 7 is a plan view which illustrates another example of the past.

DETAILED DESCRIPTION OF THE PREFERRED EMBODIMENTS

The specific embodiments of the present invention will be explained more precisely with reference to the attached drawings, hereunder.

As stated above, the charged particle beam exposure method according to the present invention is one in which a unit pattern is repeatedly exposed using a partial overall exposure method in which the shot positions are shifted as the repeated exposures are made, the required amount of exposure for one shot to form a pattern is 1/n (where n is an integer of at least 2) and in which one and the same region on a wafer is exposed n times in overlapped fashion.

Further in this method, it is preferable that both the case in which the shot position is shifted so that the exposed region of the unit pattern does not overlap with the exposed region of the previous shot, and the case in which the shot position is shifted so that the exposed region of the unit pattern overlaps with the exposed region of the previous shot.

In the present invention, it is preferable that the above-mentioned two cases are carried out in one operation as a combination thereof.

Therefore, the following embodiment is also available as one of the embodiments of the present invention.

For example, a charged-particle beam exposure method in which the method further includes a case in which the exposure of a unit pattern is shifted so that a current exposure region does not overlap onto an immediately previous exposure region and thereafter the same unit pattern is further shifted over the previously exposure regions so as to perform the overlaid multiple exposures on the regions by a partial overall exposure method, and wherein the exposure for each shot as being 1/n (where n is an integer of 2 or greater) of an amount of exposure that is necessary to form a pattern is used so as to perform overlaid multiple exposure n times in total.

EXAMPLE 1

Figure 1:
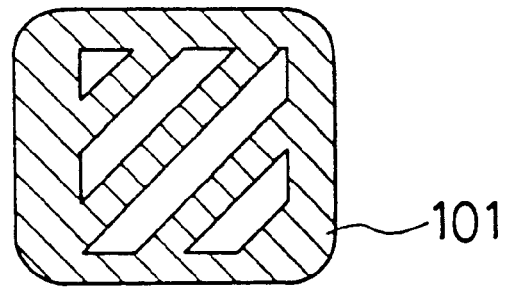
FIG. 1(a) and FIG. 1(b) are plan views which shows an aperture mask and a transfer pattern, respectively for the purpose of illustrating the first embodiment of the present invention.
Figure 1:
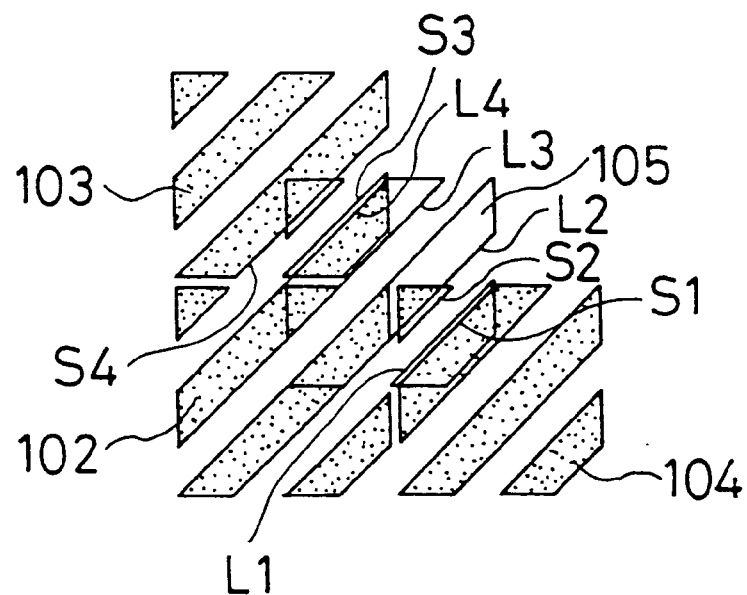

FIG. 1 is a plan view which illustrates the first embodiment of the present invention, with FIG. 1(a) showing the aperture mask, and FIG. 1(b) showing the transfer pattern than is formed.

A partial overall exposure pattern mask is used to perform exposure of the slanted-line pattern which is shown in FIG. 1(a), the transfer pattern 102 as shown in FIG. 1(b), being formed on the wafer by the first shot, the transfer pattern 103 being formed on the wafer by the second shot, and the transfer pattern 104 being formed on the wafer by the third shot.

When doing this, the amount of exposure is ½ of the case in which multiple exposure is not done.

Next, using the same mask, the transfer pattern 105 as shown in FIG. 1(b), is formed by shifting from the transfer pattern 102 by an amount in the left-to-right direction and in vertical direction that is ½ the exposure region for one shot.

This is then repeated until the pattern is repeated over the entire area of the chip.

In terms of a specific method of exposure, after forming the transfer patterns 102 and 103, the shot position is shifted in the perpendicular direction to that in which the transfer patterns 102 and 103 are arranged, so as to form the transfer pattern 104 and so on.

Then, the shot position is shifted by an amount of ½ of the shot area in the left-to-right direction and vertical direction with respect to the transfer pattern 102, and exposure is performed, to complete the exposure of the transfer pattern 105.

This kind of operations will be repeatedly carried out so as to complete to form a final pattern comprising certain amounts of these unit patterns arranged to each other and overlaid with each other with the pitch shifted by ½ pitch of the unit pattern in both directions.

In performing exposure with an electron beam, the amount of exposure is established by and is proportional to the current value and the exposure time in the exposure apparatus.

Because the current value is always constant, the amount of time for ½ the amount of exposure is ½ the exposure time.

Therefore, the increase in the amount of exposure time using multiple exposure with the beam deflecting system, is only the time to deflect the beam.

Because the deflection time is 1/10 to 1/100 of the exposure time, the amount of time to form the pattern can grow to no more than about 1.1 times.

As explained above, in the charged-particle beam exposure method of the present invention, the shift of a shot position is carried out in the left-to-right direction, in the vertical direction, or in both the left-to-right and vertical directions, so that the current exposed region is partially overlaid with an immediately previous exposure region.

Moreover, the unit pattern is configured from a repeated pattern formed at a prescribed pitch, the shift in shot position being an integral multiple of said pitch.

In this embodiment, even when, for example, the positions of the transfer patterns 103 and 104 has been skewed from the position of the transfer pattern 102, the lines of the skewed pattern S1, S2, S3, S4 or the like, can be repaired so as to form the correct lines of the transfer pattern by exposing the partial overall exposure with the pattern shifting of 1/n pitch of the unit pattern and with 1/n amount of exposure power which is necessary to normally form the transfer pattern.

Because, the part of the transfer pattern, which is suffered from the multiple overlaid exposures, can be moved to the correct lines of the pattern as shown by a bold lines L1 to L4 belonging to the transfer pattern 105, so as to correct the skewed line to form the precise continuous pattern comprising a plurality of unit patterns.

Accordingly, the present invention is very useful in performing the partial overall exposure system to form the overlaid multiple exposing patterns with the pattern having a specific configuration, as shown in FIG. 1(a).

Therefore, the unit pattern which can be preferably used in the present invention, is configured so as to comprise a plurality of pattern elements-each having a longitudinal axis and each having a longitudinal length being the same as or different from each other and the pattern elements being arranged parallel to each other.

Further, in the unit pattern as mentioned above, a plurality of pattern elements are arranged in the unit pattern with a predetermined pitch and with a predetermined angle with respect to a predetermined direction.

FIG. 2 is a graph which shows the shot image and the distribution of accumulated energy distribution for the case in which the mask that is shown in FIG. 1(a) is used, and in which the transfer pattern 202 formed by the second shot is deflected from the predetermindely defined position with respect to the transfer pattern 201 which was formed by the first shot.

FIG. 2(a) shows the case in which the deflection of the transfer pattern 202 with respect to the transfer pattern 201, is given in the upward direction, FIG. 2(b) shows the case in which the deflection of the transfer pattern 202 with respect to the transfer pattern 201, is given in the downward direction, and FIG. 2(c) shows the case in which the deflection of the transfer pattern 202 with respect to the transfer pattern 201, is given in the left-to-right direction.

The graphs FIGS. 2(a1), (b1), and (c1) show the accumulated energy distribution for the case in which the present invention is applied, and the graphs FIGS. 2(a2), (b2), and (c2) show the accumulated energy distribution for the case in which the exposure had done by the method of the past.

The process conditions are usually established so that the required accumulated energy threshold for pattern formation is the middle value between the maximum value and the minimum value of accumulated energy.

In the graphs FIGS. 2(a1) through (c2), the energy threshold is indicated by the broken line.

In each of these graphs, the pattern is formed in the part having an accumulated energy that is greater than the threshold.

In FIG. 2(a), because the intermediate part of patterns 201 and 202 is exposed by using the present invention, the accumulated energy of the connecting part rises to greater than the threshold, making it possible to avoid an open defect.

In the case of FIG. 2(b), according to the present invention, since the amount of exposure each time is reduced, the result being reduction in the overexposed part, this suppressing an increase in the line width, and avoiding the occurrence of a bridge.

In the case of FIG. 2(c) as well, similar to the case of FIG. 2(b), because there is a reduction in the amount of exposure in the overlapped part of the pattern caused by the pattern deflection due to the positional skew of the pattern, it is possible to suppress the occurrence of a bridge defect between neighboring patterns.

In contrast to the above, according to the method of the past, which does not use multiple exposure, as shown in FIG. 2 (a2), there is a large danger of an open connection and, as shown in FIGS. 2(b2) and 2(c2), there is a large possibility of the occurrence of a bridge defect caused by an increased amount of accumulated energy between neighboring patterns.

Although in the above-described embodiment, the shift of the multiple shot position was in a diagonal direction and was of an amount of ½ of one shot (two pattern pitches), with double exposure being done, it is also possible to change the amount of position shift and the number of multiple exposures that are performed.

For example, it is possible to make the amount of the shift in the diagonal direction be ½ of that in the first embodiment (one pattern pitch) and to perform a quadruple multiple exposure to form the pattern.

There is also no limitation to a shot position shifting direction that is at 45 degrees as in the first embodiment, it being possible to select the angle as appropriate (including a direction of 0 or 90 degrees).

EXAMPLE 2

Figure 3A:
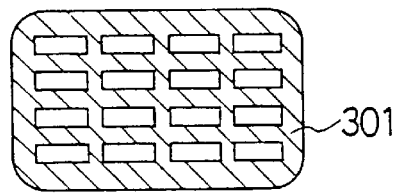
FIG. 3(a) is a plan view of the aperture mask used in the second embodiment of the present invention and FIGS. 3(b), 3(c) and 3(e) are plan views of the transfer patterns of the aperture mask shown in FIG. 3(a), and FIGS. 3(d) and 3(f) are graphs showing the distribution of the accumulated energy measured for the transfer patterns as shown in FIGS. 3(c) and 3(e), respectively. by way of illustrating the second embodiment of the present invention.
Figure 3B:
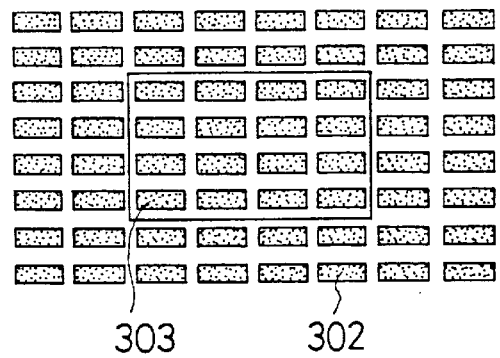

FIG. 3 illustrates the second embodiment of the present invention, with FIG. 3(a) being a plan view of an aperture mask that is used in the second embodiment, and FIG. 3(b) being a drawing which shows the condition of the transferred pattern.

This embodiment can be used in the case of forming an island-shaped pattern preferably used as an activated region that is surrounded by a field oxidation film or used as an accumulator pattern for a stacked capacitor.

Using the aperture pattern 301 which is shown in FIG. 3(a), first, for example, at least four transferred patterns 302 being adjacently arranged in a predetermined rectangular region is formed and in that each one of the transferred patterns 302 is independently shot on one shot exposure region of a wafer, respectively, without making any overlapping part with each other.

Then, a transfer pattern 303 is formed, as shown in FIG. 3(b), by overlapping the aperture pattern 301 on the four transferred patterns 302 already formed and by shifting by an amount of ½ of the exposure region of one shot each in the left-to-right direction and in the vertical direction.

This exposure pattern is repeated over the surface of the chip.

Thus, in this embodiment as well, double exposure is performed in a large number of exposure regions, with the exception of the edge part of the repeated pattern.

Figure 3C:
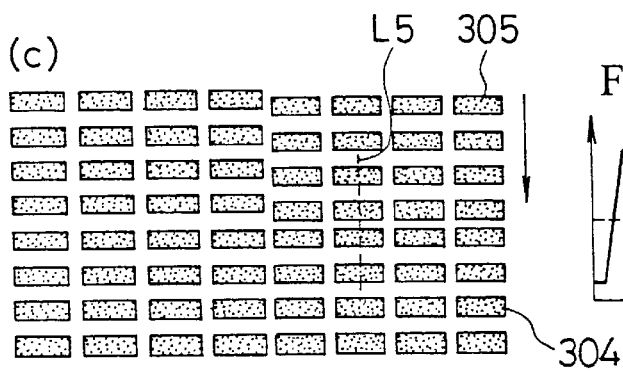
Figure 3D:
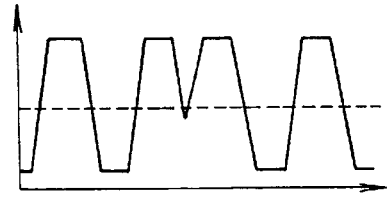

In the mask which is shown in FIG. 3(a), in the case in which exposure is performed using the method of the past, which does not use multiple exposure, as shown in FIG. 3(c), when a positional deflection of pattern elements caused by the position shift occurs in the transfer pattern 305 that is formed by the n-th shot with respect to the transfer pattern 304 which is formed by the n-1st shot, the accumulated energy distribution of the part shown by the broken line L5 in FIG. 3(c), is as shown in FIG. 3(d).

As shown in FIG. 3(d), the amount of energy accumulated in the boundary part between where the patterns approach one another, becomes large, so that the possibility of the occurrence of a bridge defect becomes large.

Figure 3E:
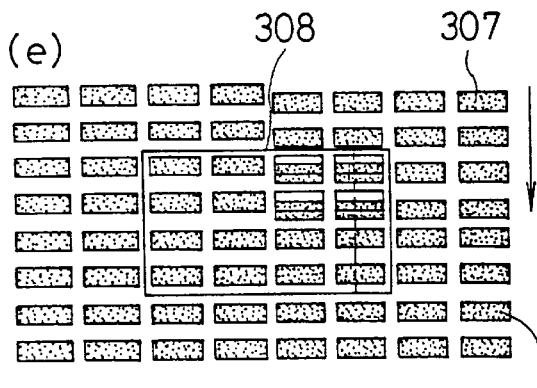
Figure 3F:
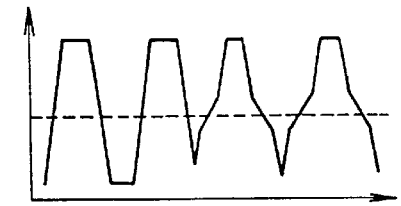

However, according to this embodiment, which uses multiple exposure, as shown in FIG. 3(e), even if the transfer pattern 307 is formed close to the transfer pattern 306, by imparting the required energy by adding the transfer pattern 308, the overall transfer pattern position approaches the proper position and, as shown in FIG. 3(f), the increase of accumulation between the patterns 306 and 307 is alleviated, making it possible to suppress the occurrence of a bridge defect.

Even in terms of statistics, the standard deviation of the pattern position for the case of n-fold multiple exposure, is said to be the $1/\sqrt{n}$ times the case in which multiple exposure is not performed.

Thus, by performing multiple exposure, the pattern position accuracy is improved.

Although, in the above-described second embodiment of the present invention, the shot position shift was just ½ of the exposure region for one shot (two pattern pitches), it is also possible to make the amount of shift be ½ that of the above-noted embodiment.

Additionally, the present invention is not limited in application to electron beam exposure, and can also be applied to an exposure method that employs an ion beam.

EXAMPLE 3

In the case in which a pattern is formed by multiple exposure as is done in the above-noted first and second embodiments, there inevitably occurs an under exposed region at the edge part or corner part of the repeated pattern.

In the third embodiment of the present invention, by performing a separate exposure of this under exposed region, it is possible to obtain the same exposure amount over the entire region.

Figure 4:
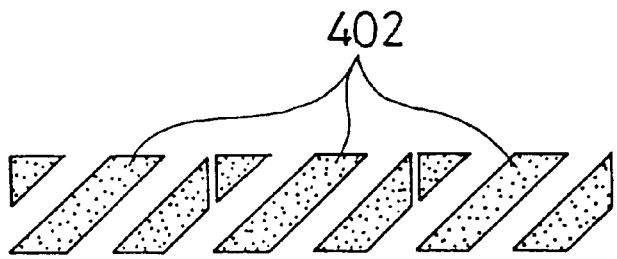
FIGS. 4(a) to 4(d) are plan views which illustrate the third embodiment of the present invention.
Figure 4:
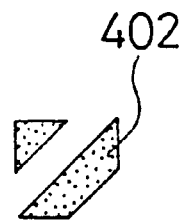
Figure 4:
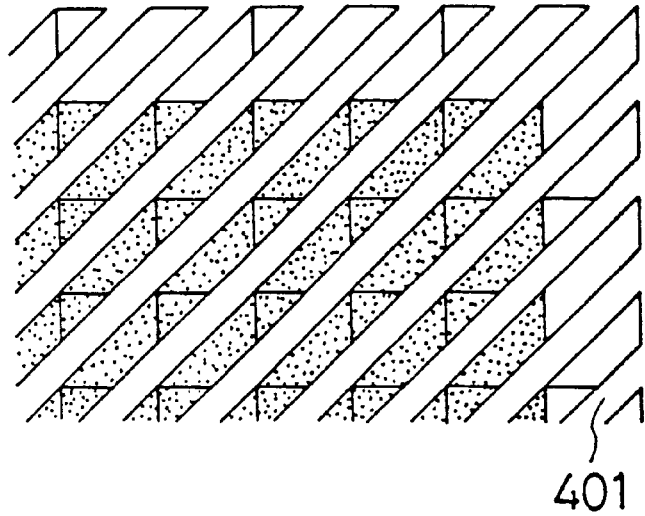
Figure 4:
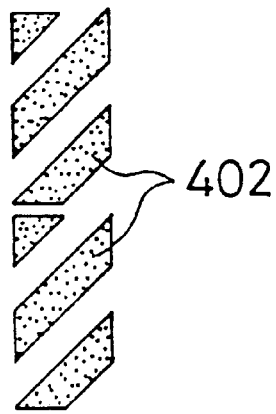

For example, as shown in FIG. 4(a), in the case of the first embodiment, there is insufficient exposure in the edge part 401.

In this case, the variable formed exposure is performed with respect to this edge part 401 to compensate this under exposure.

If a partial overall exposure pattern aperture masks 402 each having the respective size in accordance with the amount of shift, are fabricated beforehand, as shown in FIGS. 4(b) to 4(d), those mask patterns can be selected when exposing at the pattern edge, thereby solving the problem of insufficient exposure at the pattern edge.

Figure 5:
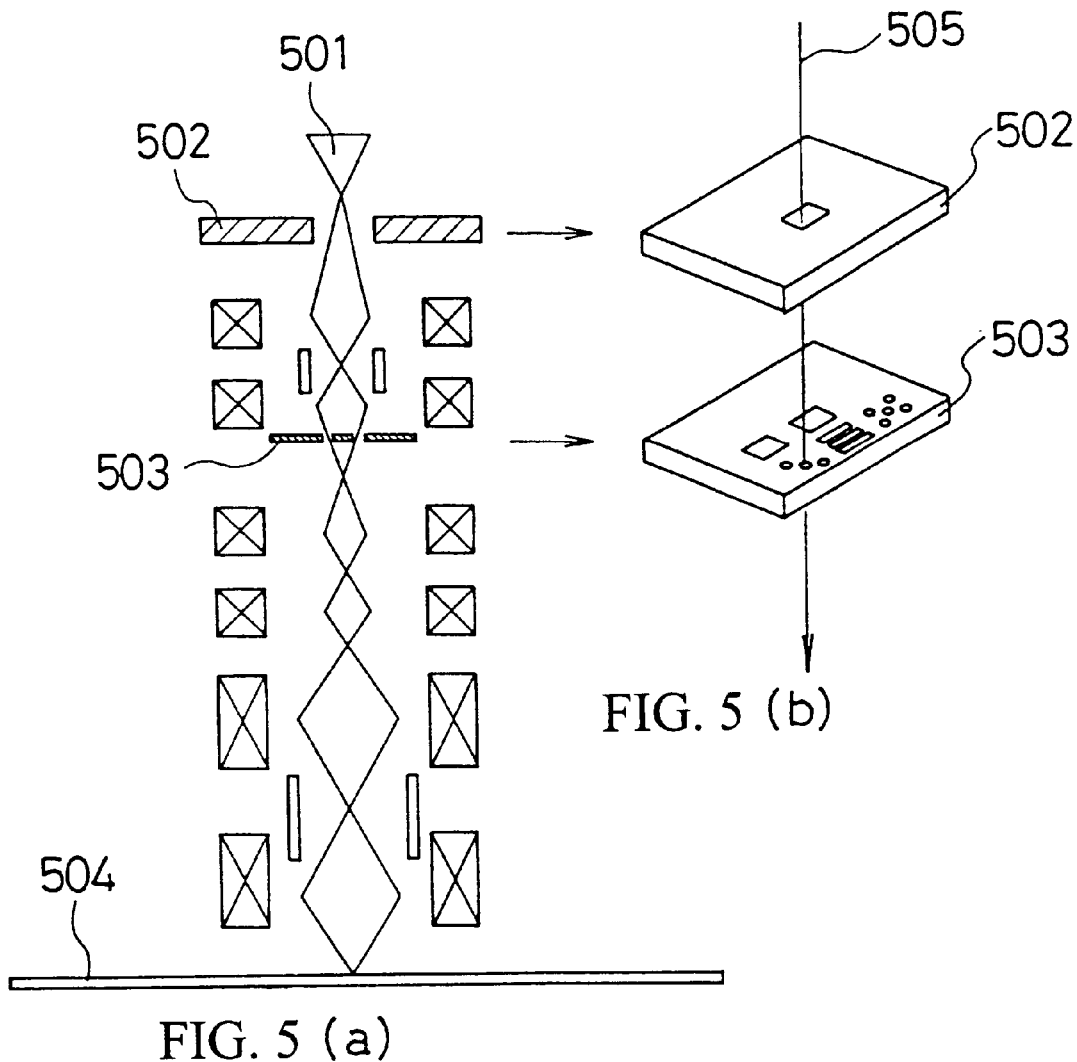
FIG. 5 is a simplified drawing of the configuration of an electron beam exposure apparatus.
Figure 6:
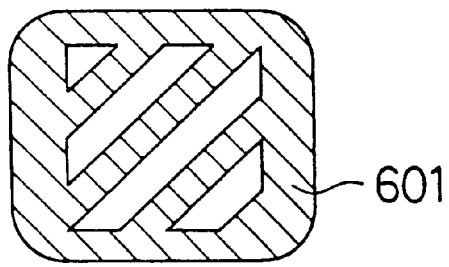
FIG. 6 is a plan view which illustrates an example of the past.
Figure 6:
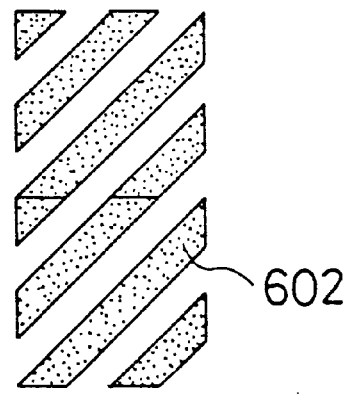
Figure 6:
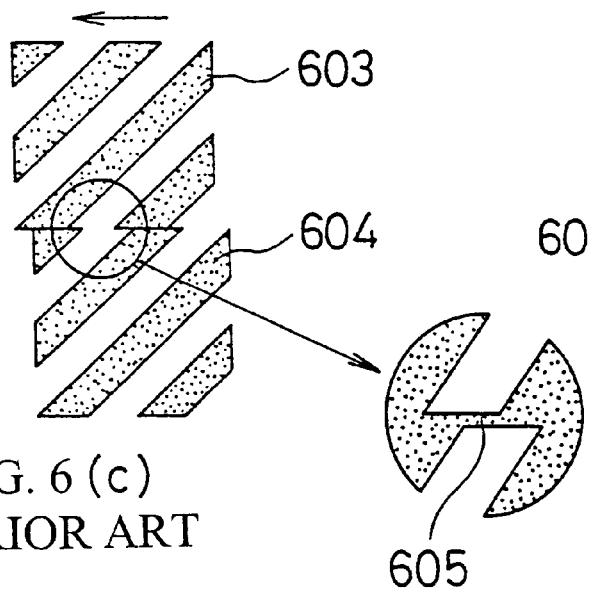
Figure 6:
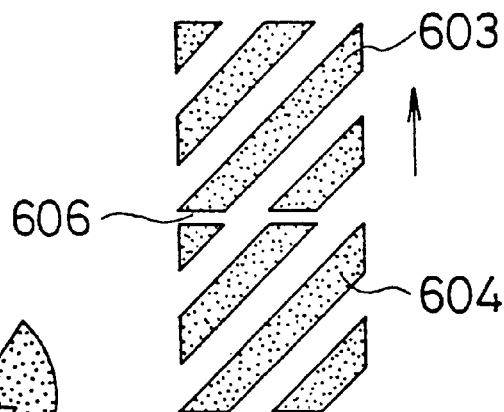
Figure 8:
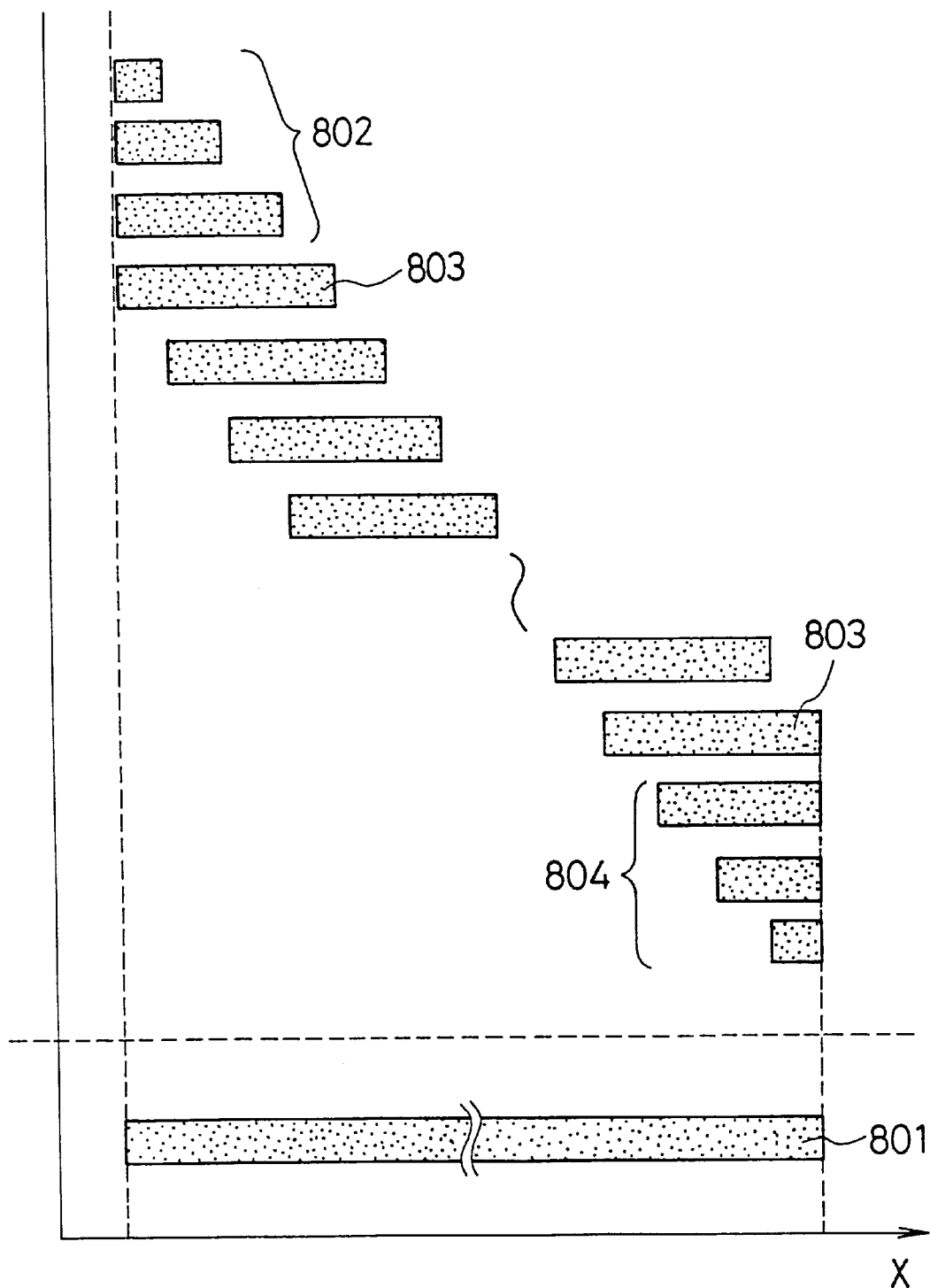
FIG. 8 is a drawing which illustrates the first improvement example.
Figure 9:
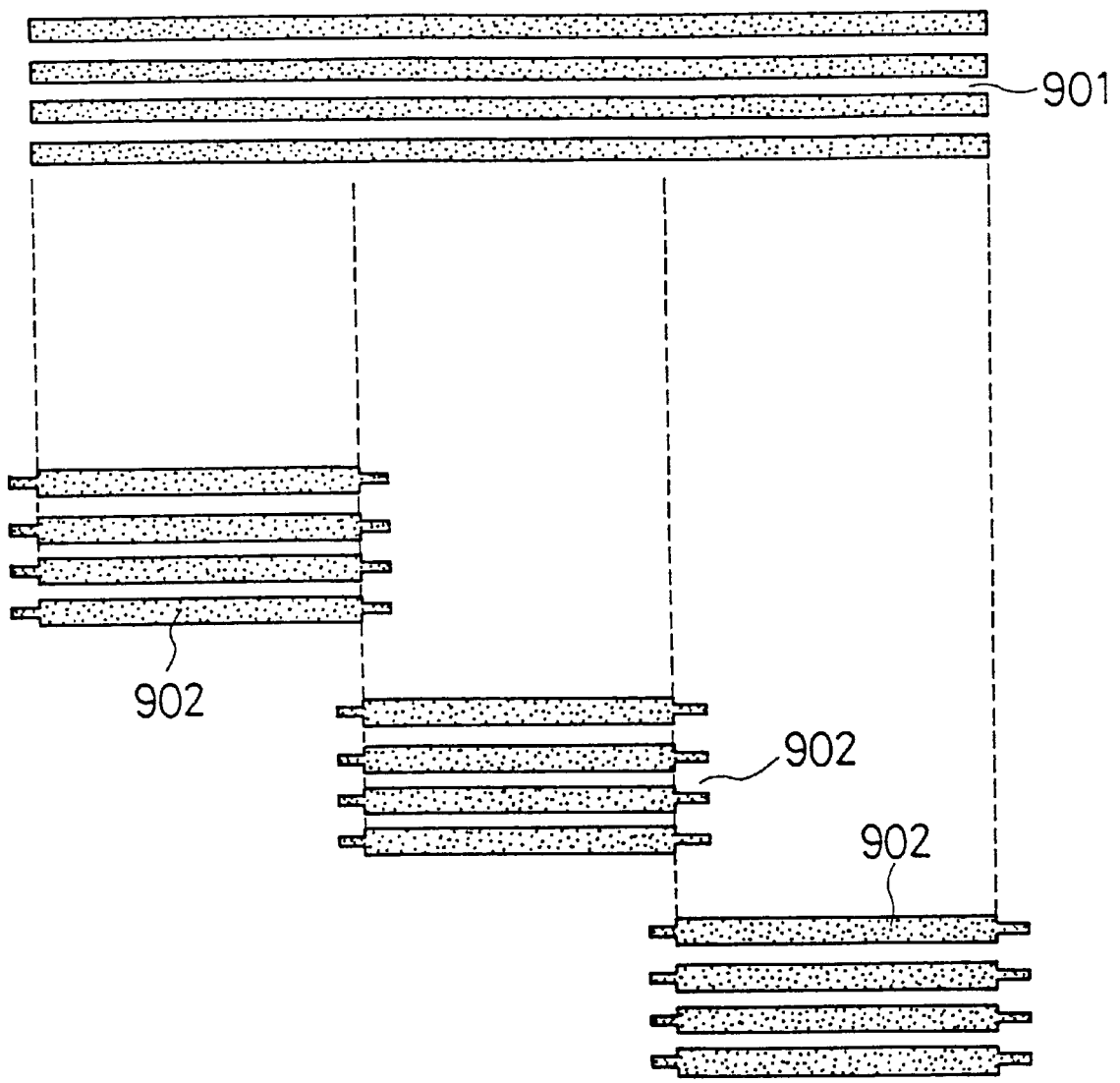
FIG. 9 is a drawing which illustrates the second improvement example.

In the above-mentioned examples, in forming the predetermined patterns on a wafer, the apparatus as shown in FIG. 5 can be preferably used with selecting suitable software so as to control the necessary parts and devices described in FIG. 5, in order to form the pattern.

Another aspect of the present invention is a method for making a predetermined pattern on a wafer.

In this separate aspect, the method for making a predetermined pattern on a wafer, in that a unit pattern is repeatedly exposed on a wafer by a partial overall exposure method, and wherein a shot position being shifted for each shot, further wherein the pattern making method of the present invention comprises the steps of, establishing an amount of exposure for each shot as being 1/n (where n is an integer of 2 or greater) of an amount of exposure that is necessary to form a pattern, and performing overlaid multiple exposures n times on the same region formed on said wafer, while shifting the shot position so that part of a current exposure region thereof overlays onto an immediately previous exposure region.

Further in the method for making a predetermined pattern on a wafer of the present invention, the method further includes a case in which said exposure of a unit pattern is shifted so that a current exposure region does not overlap onto an immediately previous exposure region and thereafter the same unit pattern is further shifted over said previous exposure regions so as to perform said overlaid multiple exposures on the regions by a partial overall exposure method, and wherein the exposure for each shot as being 1/n (where n is an integer of 2 or greater) of an amount of exposure that is necessary to form a pattern is used so as to perform overlaid multiple exposure n times in total.

The method for making a predetermined pattern on a wafer in the present invention, the shift of a shot position is carried out in the left-to-right direction, in the vertical direction, or in both the left-to-right and vertical directions, so that the current exposure region is partially overlaid with an immediately previous exposure region.

In the method for making a predetermined pattern on a wafer according to the present invention, an area having an insufficient amount of exposure at an edge part of an exposure region caused by shifting of the exposure position, is exposed by variably formed exposure or by partial overall exposure of the insufficiently exposed pattern.

As described in detail above, because the exposure method of the present invention performs multiple exposure n times with an exposure amount that is 1/n of the required exposure amount while shifting the shot position for each shot, it is capable of suppressing the positional shift of the exposure pattern.

In an embodiment in which multiple exposure is performed on the inside of a shot, in which there is no connection defect in the shot border region, it is capable of more reliably suppressing the occurrence of bridge defects and open circuit defects at the pattern connection part.

What is claimed is:

1. A charged-particle beam exposure method whereby a unit pattern is repeatedly exposed on a wafer by a partial overall exposure method, a shot position being shifted for each shot, said charged-particle beam exposure method comprising steps of:

establishing an amount of exposure for each shot as being 1/n (where n is an integer of 2 or greater) of an amount of exposure that is necessary to form a pattern, and performing overlaid multiple exposures n times on the same region formed on said wafer, while shifting the shot position so that a part of a current exposure region thereof overlays onto an immediately previous exposure region, wherein said unit pattern is configured from a repeated pattern formed at a prescribed pitch, the shift in shot position being an integral multiple of said pitch.

2. A charged-particle beam exposure method according to claim 1, wherein said method further includes a case in which exposure of a unit pattern is performed as the shot position is shifted so that a part of a current exposure region does not overlap onto an immediately previous exposure region.

3. A charged-particle beam exposure method according to claim 1, wherein said method further includes a case in which said exposure of a unit pattern is shifted so that a part of a current exposure region does not overlap onto an immediately previous exposure region and thereafter the same unit pattern is further shifted over said previously exposure regions so as to perform said overlaid multiple exposures on said regions by a partial overall exposure method, and wherein the exposure for each shot as being 1/n (where n is an integer of 2 or greater) of an amount of exposure that is necessary to form a pattern is used so as to perform overlaid multiple exposure n times in total.

4. A charged-particle beam exposure method according to claim 1, wherein said shift of a shot position is carried out in the left-to-right direction, in the vertical direction, or in both the left-to-right and vertical directions, so that the current exposure region is partially overlaid with an immediately previous exposure region.

5. A charged-particle beam exposure method according to claim 1, wherein said unit pattern is configured so as to comprise a plurality of pattern elements each having a longitudinal axis and each having a longitudinal length being same as or different from each other and said pattern elements being arranged in parallel to each other.

6. A charged-particle beam exposure method according to claim 5, wherein said plurality of pattern elements are arranged in said unit pattern with a predetermined pitch and with a predetermined angle with respect to a predetermined direction.

7. A charged-particle beam exposure method according to claim 1, wherein an area having an insufficient amount of exposure at an edge part of an exposure region caused by shifting of the exposure position, is exposed by variably formed exposure or by partial overall exposure of the insufficiently exposed pattern.

8. A method for making a predetermined pattern on a wafer, whereby a unit pattern is repeatedly exposed on a wafer by a partial overall exposure method, a shot position being shifted for each shot, said pattern making method comprising steps of:

establishing an amount of exposure for each shot as being 1/n (where n is an integer of 2 or greater) of an amount of exposure that is necessary to form a pattern, and performing overlaid multiple exposures n times on the same region formed on said wafer, while shifting the shot position so that a part of a current exposure region thereof overlays onto an immediately previous exposure region, wherein said unit pattern is configured from a repeated pattern formed at a prescribed pitch, the shift in shot position being an integral multiple of said pitch.

9. A method for making a predetermined pattern on a wafer according to claim 8, wherein said method further includes a case in which said exposure of a unit pattern is shifted so that a part of a current exposure region does not overlap onto an immediately previous exposure region and thereafter the same unit pattern is further shifted over said previously exposure regions so as to perform said overlaid multiple exposures on the regions by a partial overall exposure method, and wherein the exposure for each shot as being 1/n (where n is an integer of 2 or greater) of an amount of exposure that is necessary to form a pattern is used so as to perform overlaid multiple exposure n times in total.

10. A method for making a predetermined pattern on a wafer according to claim 8, wherein said shift of a shot position is carried out in the left-to-right direction, in the vertical direction, or in both the left-to-right and vertical directions, so that the current exposure region is partially overlaid with an immediately previous exposure region.

11. A method for making a predetermined pattern on a wafer according to claim 8, wherein said unit pattern is configured so as to comprise a plurality of pattern elements each having a longitudinal axis and each having a longitudinal length being same as or different from each other and said pattern elements being arranged in parallel to each other.

12. A method for making a predetermined pattern on a wafer according to claim 11, wherein said plurality of pattern elements are arranged in said unit pattern with a predetermined pitch and with a predetermined angle with respect to a predetermined direction.

13. A method for making a predetermined pattern on a wafer according to claim 8, wherein an area having an insufficient amount of exposure at an edge part of an exposure region caused by shifting of the exposure position, is exposed by variably formed exposure or by partial overall exposure of the insufficiently exposed pattern.

14. A method for making a predetermined pattern on a wafer, whereby a unit pattern is repeatedly exposed on a wafer by a partial overall exposure method, a shot position being shifted for each shot, said pattern making method comprising steps of:

establishing an amount of exposure for each shot as being 1/n (where n is an integer of 2 or greater) of an amount of exposure that is necessary to form a pattern, and performing overlaid multiple exposures n times on the same region formed on said wafer, while shifting the shot position so that a part of a current exposure region thereof overlays onto an immediately previous exposure region, wherein said method further includes a case in which said exposure of a unit pattern is shifted so that a current exposure region does not overlap onto an immediately previous exposure region and thereafter the same unit pattern is further shifted over said previous exposure regions so as to perform said overlaid multiple exposures on the regions by a partial overall exposure method, and wherein the exposure for each shot as being 1/n (where n is an integer of 2 or greater) of an amount of exposure that is necessary to form a pattern is used so as to perform overlaid multiple exposure n times in total, wherein said unit pattern is configured so as to comprise a plurality of pattern elements each having a longitudinal axis and each having a longitudinal length being same as or different from each other and said pattern elements being arranged in parallel to each other, and said plurality of pattern elements are arranged in said unit pattern with a predetermined pitch and with a predetermined angle with respect to a predetermined direction.

15. A method for making a predetermined pattern on a wafer according to claim 14, wherein said shift of a shot position is carried out in the left-to-right direction, in the vertical direction, or in both the left-to-right and vertical directions, so that the current exposure region is partially overlaid with an immediately previous exposure region.

16. A method for making a predetermined pattern on a wafer according to claim 14, wherein an area having an insufficient amount of exposure at an edge part of an exposure region caused by shifting of the exposure position, is exposed by variably formed exposure or by partial overall exposure of the insufficiently exposed pattern.

\* \* \* \* \*